(12) United States Patent
Wu et al.

(10) Patent No.: US 10,734,206 B2
(45) Date of Patent: Aug. 4, 2020

(54) TECHNIQUES FOR DETECTING MICRO-ARCING OCCURRING INSIDE A SEMICONDUCTOR PROCESSING CHAMBER

(71) Applicant: Taiwan Semiconductor Manufacturing Co., Ltd., Hsin-Chu (TW)

(72) Inventors: Feng-Kuang Wu, Hsinchu County (TW); Chih-Kuo Chang, Baoshan Township (TW); Hsu-Shui Liu, Pingjhen (TW); Jiun-Rong Pai, Jhubei (TW); Shou-Wen Kuo, Hsinchu (TW); Sing-Tsung Li, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/705,437

(22) Filed: Dec. 6, 2019

(65) Prior Publication Data
US 2020/0111652 A1    Apr. 9, 2020

Related U.S. Application Data

(63) Continuation of application No. 16/232,404, filed on Dec. 26, 2018, now Pat. No. 10,559,453, which is a (Continued)

(51) Int. Cl.
*H01J 37/32* (2006.01)
(52) U.S. Cl.
CPC .. *H01J 37/32944* (2013.01); *H01J 37/32174* (2013.01); *H01J 37/32183* (2013.01)

(58) Field of Classification Search
CPC .......... H01J 37/32944; H01J 37/32174; H01J 37/32183
See application file for complete search history.

(56) References Cited

U.S. PATENT DOCUMENTS

| 6,332,961 B1 | 12/2001 | Johnson et al. |
| 2002/0108933 A1 | 8/2002 | Hoffman et al. |

(Continued)

FOREIGN PATENT DOCUMENTS

| TW | 201536116 A | 9/2015 |
| WO | 2008054391 A1 | 5/2008 |

OTHER PUBLICATIONS

Swingler, et al. "Micro-Arching and Arc Erosion Minimization Using a DC Hybrid Switching Device." IEEE Transactions on Components and Packaging Technologies, vol. 31, No. 2, Jun. 2008.
(Continued)

*Primary Examiner* — Raymond R Chai
(74) *Attorney, Agent, or Firm* — Eschweiler & Potashnik, LLC

(57) ABSTRACT

Some embodiments relate to a system. The system includes a radio frequency (RF) generator configured to output a RF signal. A transmission line is coupled to the RF generator. A plasma chamber is coupled to RF generator via the transmission line, wherein the plasma chamber is configured to generate a plasma based on the RF signal. A micro-arc detecting element is configured to determine whether a micro-arc has occurred in the plasma chamber based on the RF signal.

20 Claims, 5 Drawing Sheets

Related U.S. Application Data continuation of application No. 15/855,128, filed on Dec. 27, 2017, now Pat. No. 10,170,287.

(60) Provisional application No. 62/572,838, filed on Oct. 16, 2017.

(56) References Cited

U.S. PATENT DOCUMENTS

| | | | |
|---|---|---|---|
| 2006/0049831 A1* | 3/2006 | Anwar | G01R 31/1254 324/536 |
| 2009/0207537 A1 | 8/2009 | Coumou | |
| 2012/0074951 A1 | 3/2012 | Chen et al. | |
| 2012/0075108 A1 | 3/2012 | Chen et al. | |
| 2012/0217221 A1* | 8/2012 | Hoffman | C23C 14/345 216/61 |
| 2012/0234803 A1* | 9/2012 | Liu | B23K 10/006 219/121.54 |
| 2014/0015523 A1* | 1/2014 | Rupf | G01R 33/04 324/244 |
| 2015/0069912 A1* | 3/2015 | Valcore, Jr. | H03J 7/00 315/111.21 |
| 2015/0318223 A1 | 11/2015 | Bhutta | |
| 2017/0169995 A1 | 6/2017 | Kim et al. | |
| 2018/0115298 A1 | 4/2018 | Fujimoto | |

OTHER PUBLICATIONS

Kasashima, et al. "In-Situ Detection Method for Wafer Movement and Micro-Arc Discharge Around a Wafer in Plasma Etching Process Using Electrostatic Chuck Wafer Stage With Built-in Acoustic Emission Sensor." Japanese Journal of Applied Physics, 53, 03DC04 (2014), published on Mar. 5, 2014.

Non-Final Office Action dated Jun. 28, 2018 for U.S. Appl. No. 15/855,128.

Notice of Allowance dated Nov. 23, 2018 for U.S. Appl. No. 15/855,128.

Non-Final Office Action dated May 20, 2019 for U.S. Appl. No. 16/232,404.

Final Office Action dated Oct. 9, 2019 for U.S. Appl. No. 16/232,404.

Notice of Allowance dated Oct. 30, 2019 for U.S. Appl. No. 16/232,404.

* cited by examiner

//, TECHNIQUES FOR DETECTING MICRO-ARCING OCCURRING INSIDE A SEMICONDUCTOR PROCESSING CHAMBER

REFERENCE TO RELATED APPLICATIONS

This Application is a Continuation U.S. application Ser. No. 16/232,404, filed on Dec. 26, 2018 (now U.S. Pat. No. 10,559,453, issued on Feb. 11, 2020), which is a Continuation of U.S. application Ser. No. 15/855,128, filed on Dec. 27, 2017 (now U.S. Pat. No. 10,170,287, issued on Jan. 1, 2019), which claims the benefit of U.S. Provisional Application No. 62/572,838, filed on Oct. 16, 2017. The contents of the above-referenced Patent Applications are hereby incorporated by reference in their entirety.

BACKGROUND

Semiconductor production equipment, such as a plasma-enhanced chemical vapor deposition (PE-CVD) systems, plasma etching systems, and sputtering systems, are used extensively throughout the production of modern day electronic devices. This semiconductor production equipment may contain a processing chamber lined with a dielectric material that contains a plasma inside the processing chamber. Due to the plasma having a higher electrical potential than the sidewalls of the processing chamber, breakdown of the dielectric material may occur causing a micro-arc inside the processing chamber. In some cases, the micro-arcing causes contaminants from the processing chamber sidewall to collect on a wafer being processed in the processing chamber resulting in a defective wafer.

DETAILED DESCRIPTION

Figure 1:
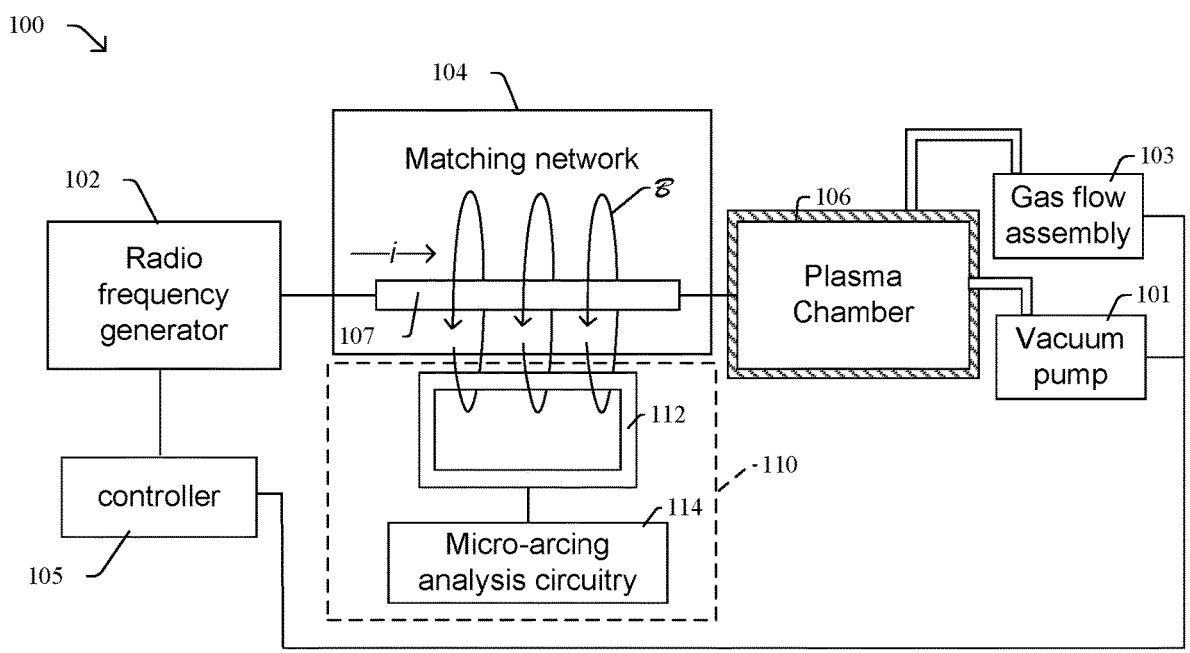
FIG. 1 illustrates a block diagram of some embodiments of a system for detecting micro-arcing occurring inside a plasma chamber.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated circuit (IC) technologies are constantly being improved. Such improvements frequently involve scaling down device geometries to achieve lower fabrication costs, higher device integration density, higher speeds, and better performance. Due to device scaling, the negative effects of micro-arcing (i.e., contaminants from the processing chamber collecting on a wafer) occurring in a plasma chamber are compounded. For example, a plasma may be generated in a plasma chamber having a dielectric layer on the inner sidewalls of the plasma chamber. Due to the high electric potential of the plasma and low electric potential of the sidewalls of the chamber, dielectric breakdown of the dielectric layer may occur inside the plasma chamber. When dielectric breakdown occurs in the plasma chamber, current can flow through the dielectric layer causing a micro-arc to occur in the plasma chamber. This micro-arc may cause atoms from the inner sidewall, or the dielectric layer, to be ejected from the inner sidewall. These ejected atoms will accumulate as contaminants on a wafer being processed inside the processing chamber. Depending on the severity of the micro-arcing, the accumulation of contaminants will result in a faulty wafer requiring all or part of the wafer to be scrapped.

The present disclosure relates to a system for detecting micro-arcing occurring inside a processing chamber. In some embodiments, the system has a radio frequency (RF) generator that outputs a RF signal. The RF generator is coupled to a matching network, and the matching network is coupled to a plasma chamber via a transmission line. A magnetic-field detector is disposed proximate the transmission line and is configured to measure a magnetic-field, which is generated due to RF current of the RF signal passing through the transmission line. By measuring the magnetic field of the RF signal along the transmission line, the magnetic-field detector can generate a magnetic-field signal without being in direct physical contact with the transmission line. Further, by providing the magnetic-field signal in real-time and in-line with the RF signal, micro-arcing occurring in the plasma chamber may be detected in real-time and remedied. This can reduce the number of scrapped wafers and/or allow defective wafers to be identified early in the process to save further unnecessary processing on the defective wafers.

FIG. 1 illustrates a block diagram of some embodiments of a system 100 for detecting micro-arcing occurring inside a plasma chamber 106. During operation of the plasma chamber 106, a vacuum pump 101 pumps an interior cavity within the plasma chamber 106 down to vacuum, and the gas flow assembly 103 provides small amounts of gases used to form a plasma in the plasma chamber 106. A controller 105 then triggers a radio frequency (RF) generator 102 to output an RF signal to ignite a plasma within the plasma chamber 106. In some embodiments, the RF generator 102 outputs the RF signal as an analog RF signal to a matching network 104 and transmission line 107. The RF generator 102 may be coupled to the matching network 104, which is configured to match a source impedance of the RF generator 102 to a load impedance of the plasma chamber 106. In some embodiments, the source impedance is an impedance of the RF generator 102, and the load impedance is an impedance of the plasma chamber 106. Further, in some embodiments, the matching network 104 matches the source impedance to about 50 ohms.

The plasma chamber 106 is coupled to the matching network 104 via transmission line 107. The plasma chamber 106 may be, for example, a plasma-enhanced chemical vapor deposition chamber. Further, the plasma chamber 106 may have a dielectric layer disposed on the sidewalls of the plasma chamber 106, which separates an inner chamber of the plasma chamber 106 from an outermost housing of the plasma chamber 106. The transmission line 107 is configured to transmit a matched RF signal to the plasma chamber 106 along a first plane (see first plane 202 in FIG. 2). In some embodiments, the transmission line 107 is a metal plate, but the transmission line 107 can also take the form of a coaxial cable, conductive micro-strip line, or twisted pair of copper wires, among others. The current of the RF signal transmitted via the transmission line 107 generates a magnetic field around the transmission line 107. The magnetic field around the transmission line 107 flows in concentric circles or ellipsoids in a second plane that perpendicularly intersects the first plane (see second plane 204 in FIG. 2).

Figure 2:
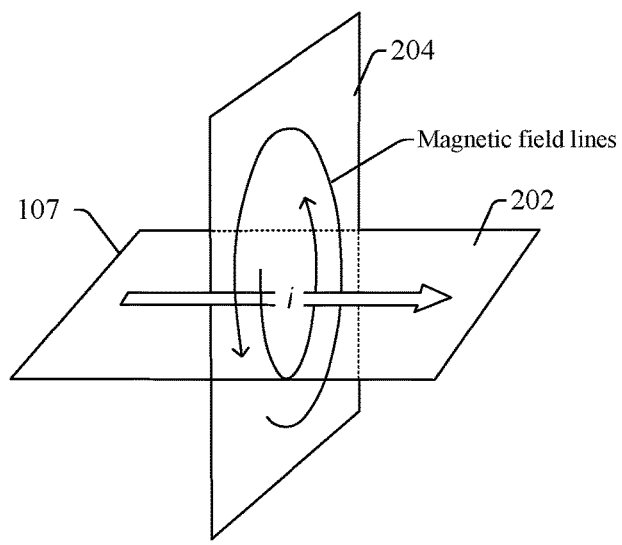
FIG. 2 illustrates some embodiments of a magnetic field generated by a current passing through a transmission line consistent with FIG. 1.

FIG. 2 illustrates some embodiments of the first plane and the second plane of FIG. 1. As illustrated, the magnetic field lines due to the RF signal curve in concentric circles, ellipsoids, or other geometries around the transmission line 107 through the first plane 202 along a second plane 204. Each point on a circle or ellipsoid has a magnetic field magnitude that is equal to that of other points on that circle or ellipsoid, with different circles or ellipsoids representing different magnetic field magnitudes. In general circles or ellipsoids further from the transmission line 107 have smaller magnitudes than circles or ellipsoids closer to the transmission line 107. Further, the magnetic field lines curve in a counterclockwise direction around the transmission line 107 with respect to the conventional current flow direction i. In other embodiments, the magnetic fields can have other geometries, which depend on the shape of the transmission line 107 as well as other magnets and/or currents near the transmission line 107 and the magnetic-field sensor 112.

Referring back to FIG. 1, a micro-arc detecting element 110 is configured to determine whether a micro-arc has occurred in the plasma chamber 106 based on a magnetic-field signal. The magnetic-field signal has a value in time that is proportional to the current provided to the transmission line 107 in time.

In some embodiments, the micro-arc detecting element 110 comprises a magnetic-field sensor 112 and micro-arcing analysis circuitry 114.

The magnetic-field sensor 112 is disposed proximate the transmission line 107. In some embodiments, the magnetic-field sensor 112 is completely outside the plasma chamber 106 and is disposed between a first end of the transmission line 107 and a second end of the transmission line 107. The magnetic-field sensor 112 may comprise a coil made of a conductive material, such as copper, nickel, aluminum, or other metals or alloys. In some embodiments, the coil is a closed conductive path. The magnetic-field sensor 112 is configured to generate a magnetic-field signal, for example in the form of a current or voltage, wherein the magnitude of the magnetic-field signal is proportional to the magnetic flux passing through the closed loop path of magnetic-field sensor 112. Thus, the magnitude of the magnetic-field signal is proportional to the magnetic field generated by the current ($i_{RF}$) of the RF signal along the transmission line 107. The magnetic-field sensor 112 is disposed in such a way as to have the magnetic field, which is generated by the RF signal to flow in a counterclockwise direction around the transmission line 107, pass through the coil and/or closed conductive path.

After the magnetic-field sensor 112 generates the magnetic-field signal based on the RF signal passing through the transmission line 107, for example in accordance with Ampere's law, the micro-arcing analysis circuitry 114 is configured to evaluate the magnetic-field signal to determine whether a micro-arc has occurred inside the plasma chamber 106. If a micro-arc is detected, the wafer can be removed and evaluated for defects, and the plasma chamber 106 can be immediately shut down until it can be tested and/or repaired.

Figure 3:
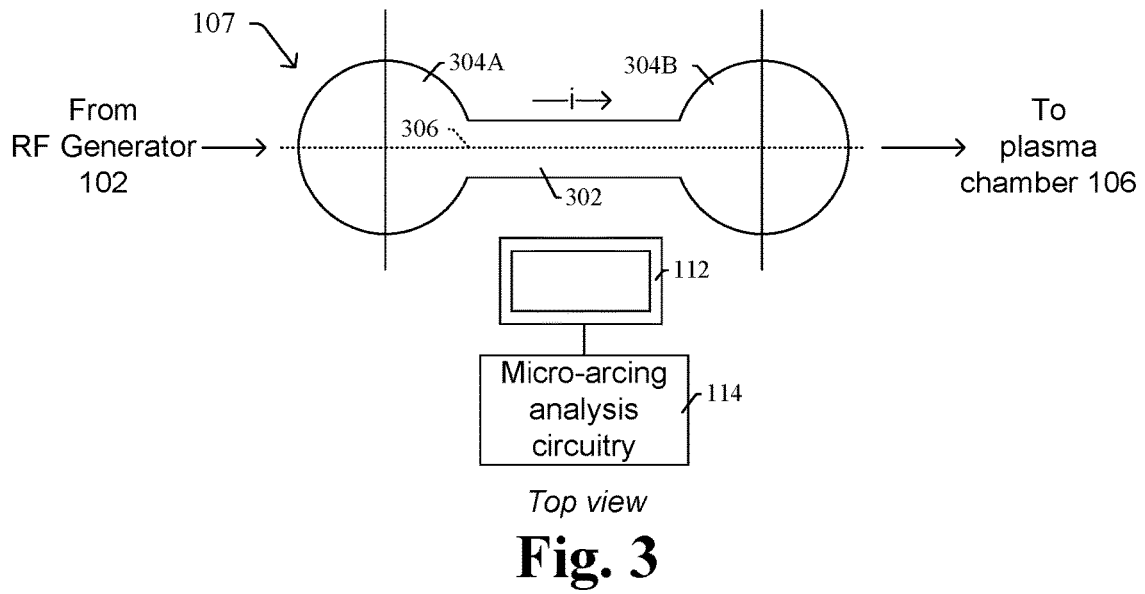
FIG. 3 illustrates some embodiments of a transmission line or plate.

FIG. 3 shows an example where the transmission line 107 manifests as a metal plate which has a central trunk 302 and bulbous or circular ends 304A, 304B on opposite ends of the central trunk 302. In some embodiments, the central trunk 302 is a rectangular-shaped plate that extends symmetrically about either side of an axis 306, and the bulbous or circular ends 304A, 304B are equal in size with one another and are each wider than the central trunk 302, and are arranged on opposite sides of the central trunk 302. In some embodiments, each bulbous or circular end 304A or 304B is also symmetrical about either side of the axis 306, so the axis 306 bi-sects the central trunk 302 and each of the bulbous or circular ends 304A, 304B.

Figure 4:
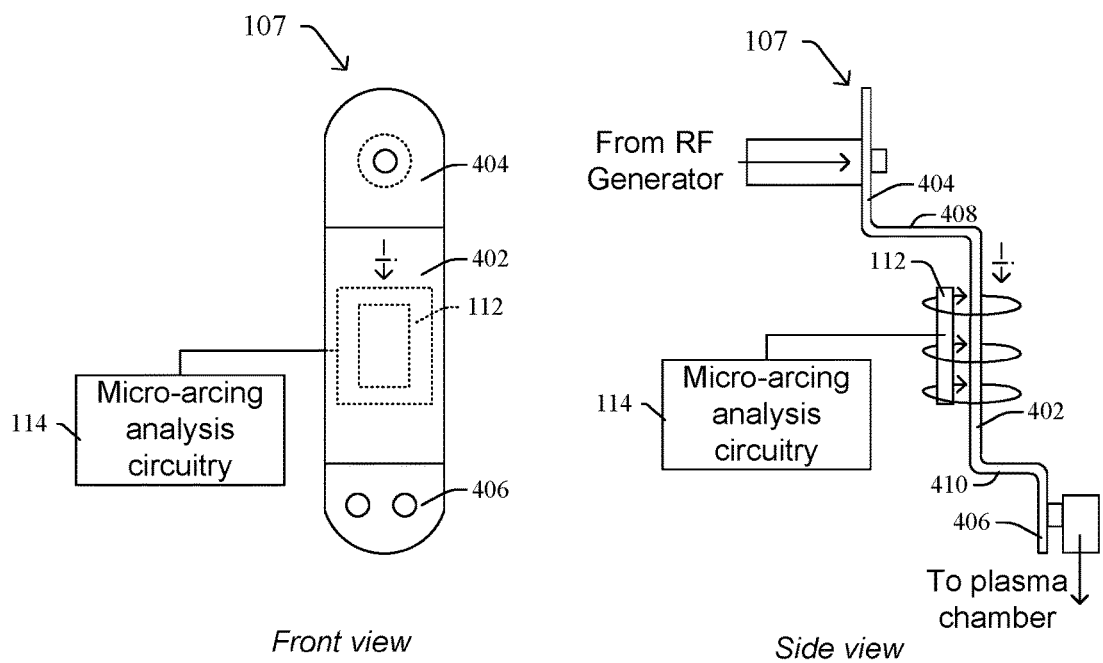
FIG. 4 illustrates some embodiments of a transmission line or plate.

In other embodiments, such as shown in FIG. 4, the transmission line 107 manifests as a metal plate that has a rectangular "step-like" geometry. In FIG. 4, the rectangular plate has a central portion 402 that lies on a first plane, and first and second end portions 404, 406 that lie along second and third planes, each of which is parallel to and spaced apart from the first plane. A first connecting portion 408 couples the central portion 402 to the first end portion 404. The first connecting portion 408 is perpendicular to the central portion 402 and the first end portion 404. A second connecting portion 410 couples the central portion 402 to the second end portion 406. The second connecting portion 410 is perpendicular to the central portion 402 and the second end portion 406, and is in parallel with but spaced apart from the first connecting portion 408.

Figure 5:
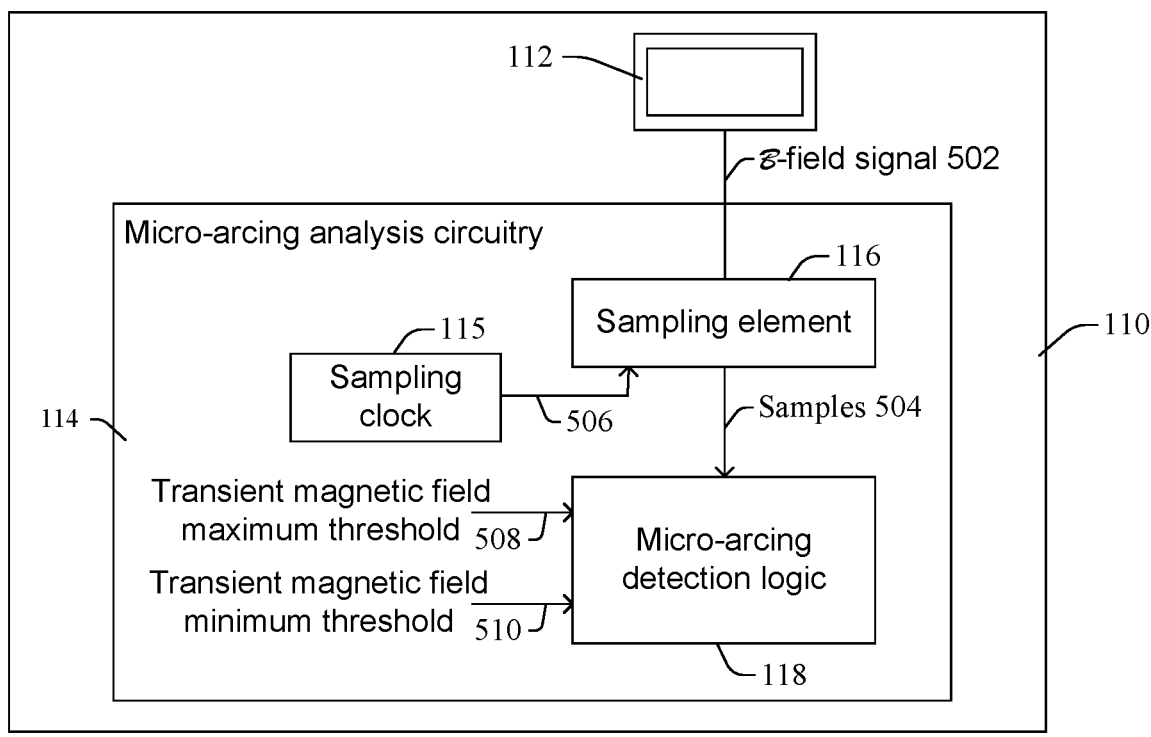
FIG. 5 illustrates some embodiments of a micro-arc detecting element, including a closed path conductive loop and micro-arcing detection circuitry.

FIG. 5 shows some embodiments of the micro-arcing analysis circuitry 114. The micro-arcing analysis circuitry 114 comprises a sampling element 116, such as an analog to digital converter (ADC), coupled to the closed path conductive loop 112. The sampling element 116 is configured to sample the magnetic-field signal 502 according to a sampling clock 506, which is established by a sampling clock generator 115, to generate a plurality of magnetic-field samples 504 that change in time. Further, the micro-arcing analysis circuitry 114 may comprise micro-arcing detection logic 118 configured to evaluate whether at least one magnetic-field sample of the plurality of magnetic-field samples 504 has a magnitude that is greater than a transient magnetic-field maximum threshold 508 or less than a transient magnetic-field minimum threshold 510 to determine whether a micro-arc has occurred.

For example, in some embodiments, the RF signal has a frequency of 13.56 MHz, and the sampling clock generator 115 has a sampling frequency of 150 MHz. The sampling element 116 thus samples the magnetic-field signal 502 and can store a 14-bit sample for each pulse of the sampling clock, with the digital value of the 14-bit sample corresponding to a magnitude of the magnetic-field signal 502 at the sampled time. Further, the micro-arcing detection logic 118 can sample 150,000 sample values per millisecond, and compare those samples to obtain a maximum value among those 150,000 sample values. In cases when a "spike" or "drop" occurs in the magnetic-field signal 502, which can correspond to a micro-arc event, the digital value of the sample taken at the time of the "spike" or "drop" indicates the presences of the micro-arcing event. For example, in some cases, the micro-arcing event may be evidenced by a "spike" where the magnetic-field signal has a sudden maximum magnitude that is between 3-4 times a steady-state maximum of the magnetic-field signal 502, or may be evidenced by "drop" where the magnetic-field signal has a sudden maximum magnitude that drops to less than half of the steady-state maximum of the magnetic-field signal 502. The duration of such a "spike" or "drop" may be relatively short, for example ranging from 1 microsecond to 100 microseconds, or may be relatively long, for example ranging from 1 millisecond to several milliseconds.

In some embodiments, the micro-arcing analysis circuitry 114 may manifest as an application specific circuit (ASIC) with transistors, semiconductor memory, and/or other semiconductor devices disposed on a semiconductor substrate and electrically coupled to one another to achieve desired functionality. In other embodiments, the micro-arcing analysis circuitry 114 may manifest as a field programmable gate array (FPGA) that has been programmed to achieve desired functionality. In still other embodiments, the micro-arcing analysis circuitry 114 can manifest as a micro-processor coupled to semiconductor memory, with software modules executing on the micro-processor to carry out desired functionality. Thus, the micro-arcing analysis circuitry 114 may consist of dedicated hardware in some implementations, and in other implementations may correspond to a combination of hardware and software to achieve desired functionality.

Figure 6:
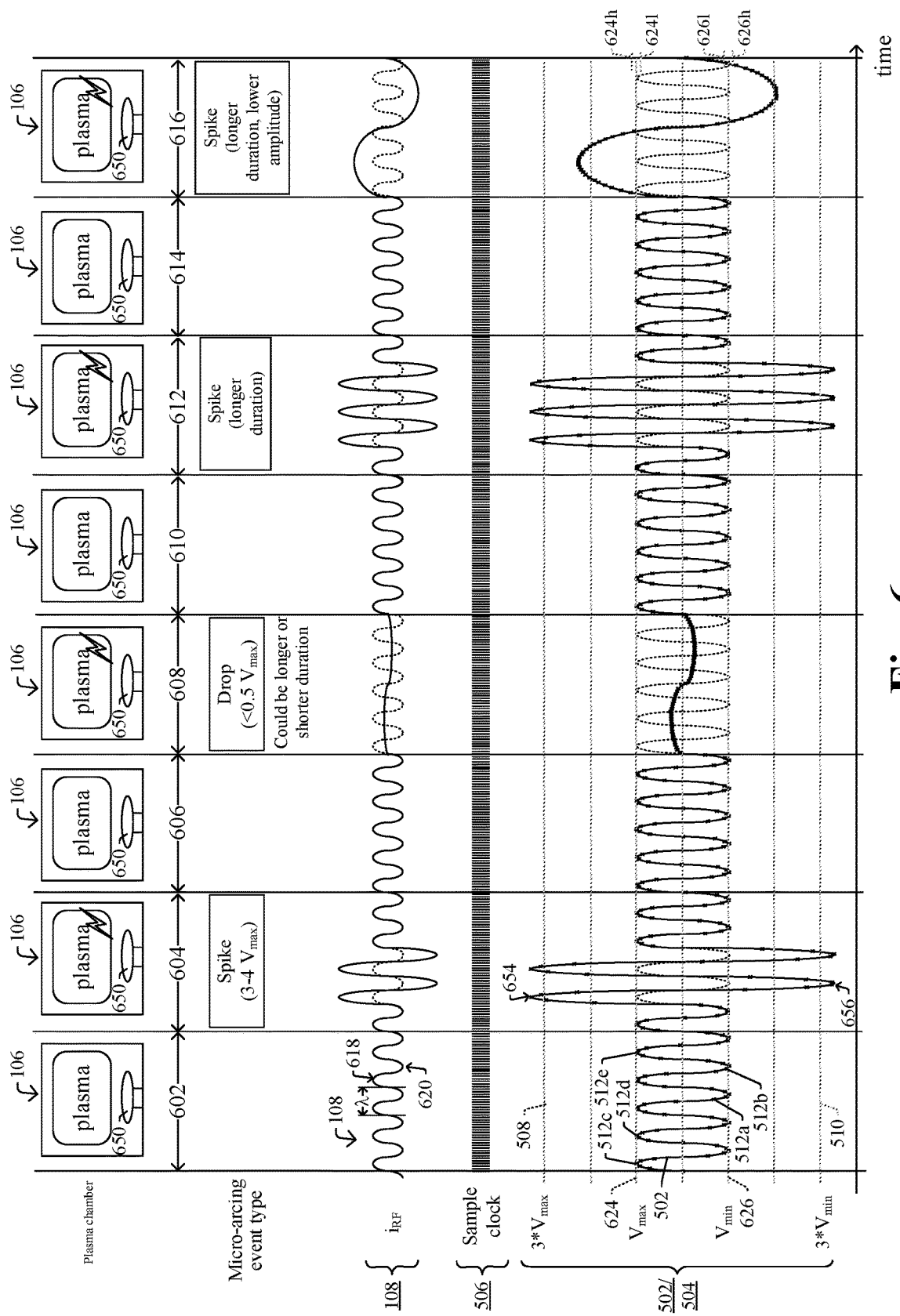
FIG. 6 shows a timing diagram and chart that illustrate a magnetic-field signal measured by a micro-arc detecting element as micro-arcing events occur inside the plasma chamber.

FIG. 6 illustrates some embodiments of how the micro-arcing analysis circuitry 114 and magnetic-field sensor 112 detect micro-arcing events inside the plasma chamber 106. For purposes of illustration, eight times 602, 604, 606, 608, 610, 612, 614, 616 are illustrated and described in the processing chamber. The uppermost portion of FIG. 6 depicts the plasma chamber 106 during each time period. As shown, for purposes of illustration, during some of the time periods (e.g., 604, 608, 612, and 616) a micro-arcing event is occurring in the plasma chamber 106, while during other time periods (e.g., 602, 606, 610, 614) a steady-state plasma is contained in the plasma chamber 106 without micro-arcing occurring.

In FIG. 6, the uppermost waveform is an example of the RF signal 108 provided by the RF generator 102 to the plasma chamber 106 via the transmission line 107. The RF signal 108 is in the form of a time-varying current, $i_{RF}$. As illustrated, during time 602, the RF signal 108 has a magnitude that oscillates according to a substantially constant frequency while varying between a substantially constant steady-state maximum amplitude (crest) 618 and substantially constant steady-state minimum amplitude 620 (trough). Thus, in some embodiments, such as the illustrated embodiment of FIG. 6, the RF signal 108 is a simple sinusoidal waveform (e.g., sine or cosine wave pattern) having a wavelength, λ, which corresponds to a single period of the waveform. In this example, each period of the waveform has two zero crossings and has a single maximum (crest) and a single minimum (trough). However, in other embodiments, the RF signal 108 can manifest as a more complicated sinusoidal waveform with higher harmonics. For example, the RF signal 108 can be a square waveform, triangular waveform, saw-tooth waveform, or a more complicated waveform. Further, in other embodiments, the RF signal 108 can have multiple relative minimums and multiple relative maximums within each period of the waveform. In some embodiments, the period of the waveform can be approximately 74 ns, corresponding to a frequency of 13.56 megahertz (MHz), however in other embodiments the period of the wave can range from approximately 10 MHz to approximately 30 MHz. In some cases, the waveform of the RF signal 108 can exhibit a substantially steady-state condition in the absence of a micro-arcing event, meaning that the waveform repeats with a substantially steady frequency, wavelength, and waveform shape at a regularly occurring period. In some embodiments, "substantially" in this context means that the frequency, wavelength, steady-state maximum amplitude and steady-state minimum amplitude vary by no more than 10% during a steady-state plasma condition in the absence of micro-arcing.

The current of the RF signal, $i_{RF}$, generates a magnetic field whose field lines form circles or ellipsoids around the transmission line 107, such as previously illustrated in FIG. 2 for example. FIG. 6 shows some embodiments of the magnetic-field signal 502 as provided by the closed conductive path 112. The magnetic-field signal 502 is a time-varying analog signal whose voltage amplitude varies in time depending on the amount of magnetic flux passing through the closed conductive path of the magnetic-field sensor 112. Samples 504 of the magnetic-field signal (e.g., 512a, 512b), which are proportional to the RF signal, are then measured according to a rising edge and/or falling edge of the sample clock 506. Typically, one sample of the analog magnetic-field signal 502 is taken at each pulse of the clock, with each sample 504 in FIG. 6 being represented as an "x" (see e.g., 512a, 512b, 512c, 512d, 512e) that is superimposed on the magnetic-field signal 502. Thus, while the magnetic-field signal 502 is an analog signal, which varies continuously in time, the magnetic field samples 504 (including 512a, 512b, 512c, 512d, 512e) are digital discrete values that are selected according to clock signal 506 and correspond to respective instantaneous values of the magnetic-field signal 502.

The sampling frequency provided by the sampling clock 506 is greater than the frequency of the RF signal 108. For example, in some embodiments, the RF signal 108 has a frequency of 13.56 MHz, and the sampling frequency is 150

MHz. Thus, for each period or "pulse" of the RF signal 108, there are a little more than 11 magnetic field samples that are measured and stored. In other embodiments, the sampling frequency can differ from 150 MHz, however, the sampling frequency should remain at least 3-4 times higher than the frequency of the RF signal 108, and preferably 10 or more times higher than the frequency of the RF signal, to help ensure the sampling accurately characterizes brief voltage excursions in the magnetic-field signal 502.

In some embodiments, each magnetic field sample 504 can be a multi-bit digital value that is encoded to represent a magnitude of the magnetic-field signal 502 taken at the sampling time. For example, if each magnetic field sample is a 14-bit sample, each magnetic field sample is capable of representing 16384 different values. If the coding of these bits are chosen so that each code represents an incremental voltage change of 0.000125 volts (V), the 16384 different encoding values allow for each code to represent a unique voltage in a voltage range of 2 V. Thus, if this voltage range is chosen to be arranged on either side of 0 V, the 14 bits of any given sample can represent a voltage between positive ~1 V and negative ~1 V. For example, if an encoding value of b'00000000000000 could correspond to −1V, while an encoding value of b'11111111111111 could correspond to +1 V. Of course, other encoding schemes could be used, and this example is in no way limiting.

The micro-arc detecting element 110 determines an average steady-state maximum amplitude value 624 of the magnetic-field signal 502 during the steady-state of the RF signal when micro-arcs are not present. In some embodiments, for example, if the RF generator 102 is designed to drive the plasma chamber 106 via the transmission line 107 by supplying a 13.56 MHz signal whose voltage amplitude varies between +0.3 V and −0.3 V, the average steady-state maximum amplitude 624 can be predetermined to be +0.3 V. In other embodiments, the micro-arc detecting element 110 analyzes the shape of the RF signal 108 by looking at the actual magnetic field samples that have been measured, and selects actual magnetic field samples that have the maximum amplitudes within some predetermined time. For example, within time 602, the micro-arc detecting element 110 can identify the magnetic field samples corresponding to crests of the magnetic-field signal 504 (e.g., magnetic field samples 512c, 512d, and 512e), and then optionally includes additional magnetic field samples that are within a predetermined expected range of the magnetic field samples of the crests (e.g., range between 624l and 624h). This allows the average steady-state maximum amplitude value 624 to account for slowly shifting or other dynamic conditions in the system.

The micro-arc detecting element 110 also determines an average steady-state minimum amplitude value 626 of the magnetic-field signal 502 during the steady-state of the RF signal 108, which reflects the state of the system when micro-arcs are not present. In some embodiments, for example, if the RF generator 102 is designed to drive the plasma chamber 106 via the transmission line 107 by supplying the RF signal 108 at 13.56 MHz, the average steady state minimum amplitude 626 for the magnetic-field signal can be predetermined to be −0.3 V based solely on how the magnetic-field signal is expected to behave, and not based on actual measurements or samples of the magnetic-field signal. In other embodiments, the average steady state minimum amplitude 626 can be measured and/or can be predetermined without any measurements being taken, and in some embodiments can include samples within a predetermined expected range of the magnetic field samples of the troughs (e.g., range between 626l and 626h).

During a first time 602, a wafer 650 is disposed within the plasma chamber 106, and a plasma is generated inside the plasma chamber 106 without any micro-arcing occurring. Thus, the RF signal 108 during this time is a steady-state sinusoidal signal, and correspondingly, the magnetic-field signal 502 has an average steady-state maximum 624 and an average steady-state minimum 626 which remain substantially constant over first time 602.

The magnetic-field signal 502 during the first time 602 oscillates between the average steady-state maximum 624 and the average steady-state minimum 626. Thus, the magnetic-field signal indicates that no micro-arcing event is occurring in the plasma chamber 106 during first time 602. In some other embodiments, the magnetic-field signal 502 (and corresponding magnetic field samples (e.g., 512a, 512b)) have peaks and troughs that vary slightly from, but which are still within a predetermined expected range of average steady-state maximum 624 and average steady-state minimum 626 during 620. For example, the crests during first time 602 can have amplitudes that range from 90% of average steady-state maximum 624 and 110% of average steady-state maximum 624, which provides for some small variations in time for the characteristics of the plasma within the plasma chamber. The troughs during first time 602 can have amplitudes that range from 90% of average steady-state minimum 626 and 110% of average steady-state minimum 626, which provides for some small variations in time for the characteristics of the plasma within the plasma chamber.

A second time 604, which is referred to as a "spike" event, depicts the plasma chamber 106 with the plasma generated inside the plasma chamber 106 and a micro-arcing event occurring. This micro-arcing event may discharge material from the sidewall of the plasma chamber 106 and/or otherwise contaminate and/or damage the wafer 650. The magnetic-field signal 502 during the second time 604 has a maximum amplitude 654 that is at least three to four times the average steady-state maximum 624, and has a minimum amplitude 656 that is at least 3-4 times the average steady-state minimum 626. Thus, the magnetic-field signal 502 (and magnetic field samples 512a-512e) are greater than a transient maximum threshold 508 and/or less than a transient minimum threshold 510, and may cross the transient magnetic-field maximum 508 and/or transient magnetic-field minimum 510 multiple times in successive pulses of the waveform. In some embodiments, a single instance of the magnetic-field signal 502 (and magnetic field samples) crossing the transient magnetic-field maximum threshold 508 or the lower transient magnetic-field minimum threshold 510 indicates a micro-arcing event has occurred. In other embodiments, when the magnetic-field signal (and magnetic field samples) crosses the transient magnetic-field maximum threshold 508 or the transient magnetic-field minimum threshold 510 a predefined number of instances, the micro-arc detecting element 110 indicates a micro-arcing event has occurred.

A third time 606 depicts the plasma chamber 106 with the plasma generated inside the plasma chamber 106 after a micro-arcing event has occurred, and the plasma chamber 106 has returned to steady-state. After the micro-arc event has occurred, the magnetic-field signal remains substantially between the transient magnetic-field maximum threshold 508 and the transient magnetic-field minimum threshold 510.

A fourth time 608 depicts the plasma chamber 106 with the plasma generated inside the plasma chamber 106 during another micro-arcing event. In fourth time 608, the micro-arcing event is characterized by a drop in the maximum and minimums of the magnetic-field signal 502 (and magnetic field sample values). In some embodiments, the presence of a micro-arcing event can be detected when the maximum amplitude for one or more pulses of the waveform is reduced to 50% or less of the average steady-state maximum 624, and/or is reduced to 50% or less of the average steady-state minimum 626. In fourth time 608, the illustrated "drop" type micro-arcing event is illustrated as having a duration equal to the fourth time 608 and as reducing the frequency of the RF signal 108 by approximately a factor of five, but in other embodiments, the micro-arcing event can have a longer duration (e.g., on the order of milliseconds) or a shorter duration (on the order of micro seconds) and the RF signal and magnetic-field signal can retain the steady-state frequency with diminished amplitude.

A fifth time 610 depicts the plasma chamber 106 after the plasma chamber 106 has returned to steady-state. During fifth time 610, the magnetic-field signal remains substantially between the average steady-state maximum 624 and the average steady-state minimum 626.

During sixth time 612, the plasma is generated inside the plasma chamber 106 during another micro-arcing event. In sixth time 612, the magnetic-field signal crosses the transient magnetic-field maximum threshold 508 and the transient magnetic-field minimum threshold 510 for a longer period of time than depicted in the second time 604, but retains the same frequency as in second time 604.

A seventh time 614 depicts the plasma chamber 106 after the plasma chamber 106 has returned to steady-state. During seventh time 614, the magnetic-field signal remains substantially between the average steady-state maximum 624 and the average steady-state minimum 626.

An eighth time 616 depicts the plasma chamber 106 with the plasma generated inside the plasma chamber 106 after a micro-arcing event has occurred. As illustrated, the magnetic-field signal has a lower frequency at a lower amplitude than the other events. Thus, rather than exhibiting a maximum amplitude that is 3-4 times the steady-state maximum amplitude (as occurred during times 604 and 612), during eighth time 616 the presence of micro-arcing event may be detected when the magnetic-field signal has a maximum value that is 2-3 times the average steady-state maximum 624 but with a frequency that is approximately one-third to one-fifth of the steady-state frequency.

It will be appreciated that the methodologies disclosed herein can detect micro-arcing conditions according to any of the times 604, 608, 612, 616 depicted in FIG. 6, as well as variations on these events. In many cases, if micro-arcing is detected during the processing of any wafer, the system will immediate flag an error and stop processing for future wafers to limit overall contamination/defects on wafers within the fab.

Figure 7:
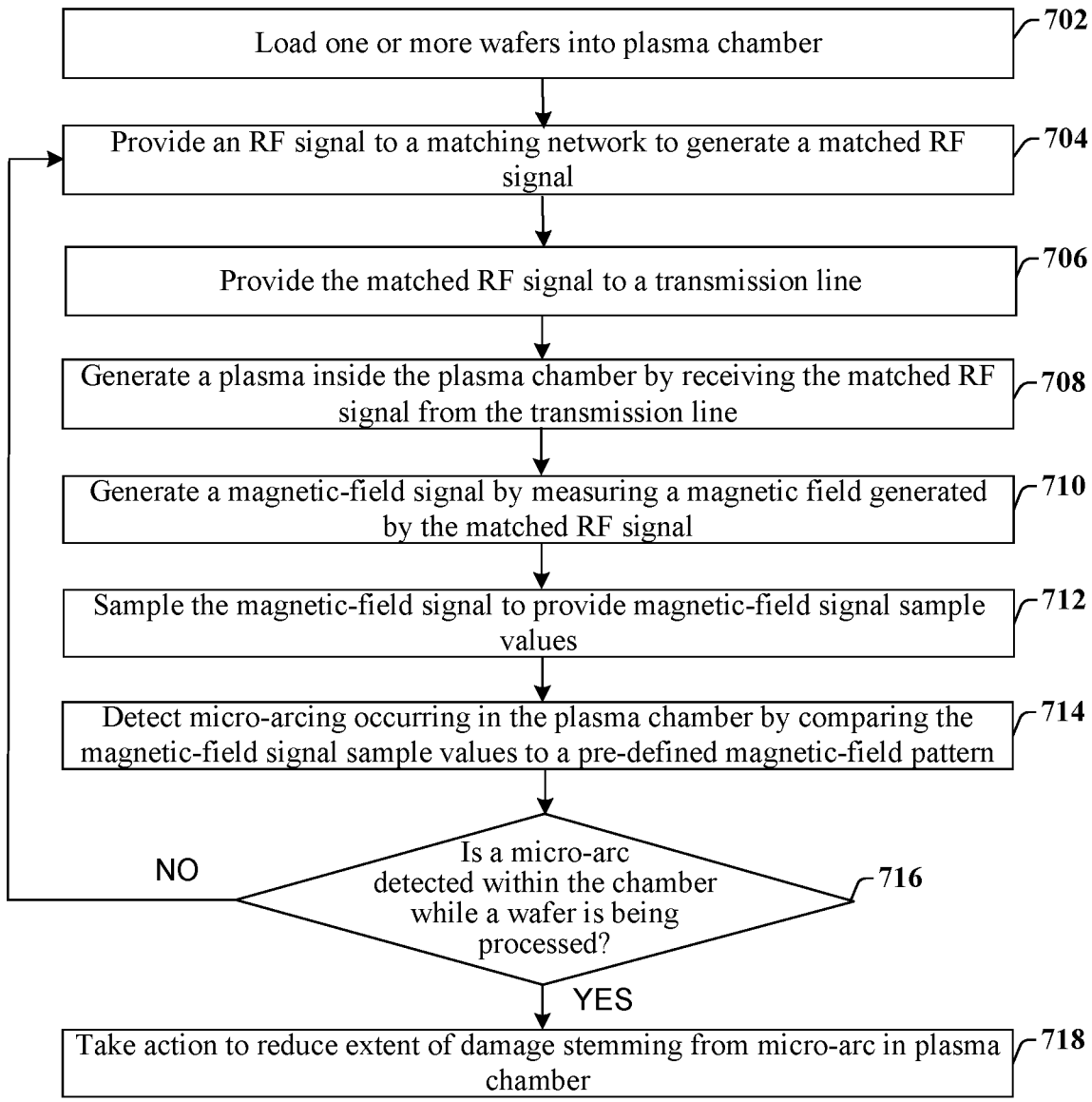
FIG. 7 illustrates a method of some embodiments of detecting micro-arcing occurring inside a plasma chamber.

FIG. 7 illustrates a method of some embodiments of detecting micro-arcing occurring inside a plasma chamber. Although the steps of the method shown in FIG. 7 are described with reference to system structures which have been previously illustrated and described, it will be appreciated that the method shown in FIG. 7 is not limited to the previously illustrated and described structures but rather may stand alone separate of the method. Further still, the order of the acts or steps depicted is not limiting, and the acts or steps can be carried out in other orders with additional acts or steps being added or with illustrated acts or steps being omitted, depending on the implementation.

At 702, one or more wafers are loaded into a plasma chamber. In some embodiments, a wafer can be a monocrystalline semiconductor wafer made entirely of monocrystalline silicon, while in other embodiments the wafer can be an semiconductor-on-insulator (SOI) substrate, which includes a handle substrate, an insulating layer disposed over the handle substrate, and a semiconductor layer (e.g., epitaxially grown silicon layer) disposed over the insulating layer. In many instances, the wafer can take the form of a disc-like (e.g., circular) wafer. Such a wafer can have a diameter of 1-inch (25 mm); 2-inch (51 mm); 3-inch (76 mm); 4-inch (100 mm); 5-inch (130 mm) or 125 mm (4.9 inch); 150 mm (5.9 inch, usually referred to as "6 inch"); 200 mm (7.9 inch, usually referred to as "8 inch"); 300 mm (11.8 inch, usually referred to as "12 inch"); or 450 mm (17.7 inch, usually referred to as "18 inch"); for example. Other substrates which are not wafers, but rather can take the form of rectangular chips, and/or other shapes, can also be processed.

At 704, an RF signal is provided to a matching network, such as matching network 104 in FIG. 1 to generate a matched RF signal.

At 706, the matched RF signal is provided to a transmission line, such as transmission line 107 in FIG. 1.

At 708, a plasma is generated inside a plasma chamber, such as plasma chamber 106 illustrated in FIG. 1, by receiving the matched RF signal from the transmission line.

At 710, a magnetic-field signal is generated by measuring a magnetic field generated by the matched RF signal.

At 712, the magnetic-field signal is sampled to provide magnetic-field signal sample values. A sampling frequency at which the magnetic-field signal is sampled is greater than an RF frequency of the RF signal.

At 714, micro-arcing occurring in the plasma chamber is detected by comparing the magnetic-field signal sample values to a pre-defined magnetic-field pattern.

At 716, a determination is made whether a micro-arc has been detected within the plasma chamber while the one or more wafers are being processed. If not ('NO' at 716) then the detection procedure continuously repeats, and the method returns to 704 until this group of wafers is unloaded from the plasma chamber for processing. After the group of wafers is unloaded, the next group of wafers can be loaded into the plasma chamber and the method can repeat for the next group of wafers.

On the other hand, however, if a micro-arc was detected ('YES' at 716) at any time during which the one or more wafers are being processed, the method proceeds to 718 and takes action to reduce an extent of damage stemming from the micro-arc that occurred in the plasma chamber. For example, the wafer(s) present in the chamber when the micro-arc occurred can be removed from the chamber and subjected to a battery of additional tests to determine whether any contaminations or defects are present due to the micro-arc. For example, the wafers can be evaluated using microscopy techniques in which the wafer is visually inspected to determine the presence of contamination or defects on the surface of the wafer; or can be evaluated using functional tests in which electrical biases (e.g., test vectors) are applied to test pads of the chips on the wafer to check whether the chips on the wafer return the correct expected results on test pads of the chips. In comparison, if a micro-arc is not detected while a group of wafers is being processed, that group of wafers can in some instances not be subjected to the battery of additional tests, but can be moved directly to the next processing apparatus.

Further still, taking action to reduce the extent of damage stemming from the micro-arc detected in the plasma chamber can include shutting down the plasma chamber before any additional wafers are processed in the plasma chamber. This immediate shut down is a particular advantage of this approach, because previous approaches have been unable to detect micro-arcs within a plasma chamber in real time. Because of this inability of previous systems, even if a wafer was damaged due to a micro-arc event, it was difficult to determine whether the cause of the contamination was a micro-arc within a given plasma chamber. Therefore, to previously identify a micro-arcing issue, a large number of wafers which suffered from contamination would only be identified further down the manufacturing process, and significant investigation would occur to isolate the cause of the contamination to be the plasma chamber. Because of the time involved with previous investigation, a significant number of wafers could be damaged before the faulty plasma generator, which suffered from micro-arcing, would be identified and shut down. With the present techniques, micro-arcing can be readily identified in real-time; and a technician can be dispatched to the tool to repair any issues to minimize the number of wafers that are contaminated due to the micro-arcing.

Thus, as can be appreciated from above, some embodiments relate to a system. The system includes a radio frequency (RF) generator configured to output a RF signal. A transmission line is coupled to the RF generator. A plasma chamber is coupled to RF generator via the transmission line, wherein the plasma chamber is configured to generate a plasma based on the RF signal. A micro-arc detecting element is configured to determine whether a micro-arc has occurred in the plasma chamber based on the RF signal.

Other embodiments relate to a system including a radio frequency (RF) generator configured to output a radio frequency (RF) signal. A transmission line is coupled to the RF generator, and a plasma chamber is coupled to the RF generator via the transmission line. The plasma chamber is configured to generate a plasma based on the RF signal. A magnetic-field sensor includes a closed conductive path proximate to the transmission line. The magnetic-field sensor is configured to generate a magnetic-field signal that varies in time commensurate with a time-varying magnetic flux passing through the closed conductive path. A micro-arc detecting element is configured to determine whether a micro-arc has occurred in the chamber based on a magnitude of the magnetic-field signal.

Still other embodiments relate to a system for detecting micro-arcing inside a plasma chamber. The system includes a radio frequency (RF) generator configured to output an RF signal to a matching network. A transmission line has a first end coupled to a matching network and a second end coupled to a plasma chamber. The first end is configured to provide the RF signal along a first plane to the second end that is coupled to a plasma chamber. The RF signal generates a magnetic field around the transmission line, and the magnetic field flows in concentric circles or ellipsoids which reside on a second plane that is perpendicular to the first plane. A magnetic-field sensor includes a coil that extends laterally in a closed loop between the first end of the transmission line and the second end of the transmission line. The coil is offset from the transmission line. The magnetic field flows through the closed loop. A micro-arc detecting element is configured to receive a signal from the magnetic-field sensor and determine whether a micro-arc has occurred in the chamber based on the signal from the magnetic field sensor.

Other embodiments relate to a method for detecting micro-arcing inside a plasma chamber. In the method, an RF signal is provided to a matching network to generate a matched RF signal. The matched RF signal is provided to a transmission line. A plasma is generated inside a plasma chamber by receiving the matched RF signal from the transmission line. A magnetic-field signal is generated by measuring a magnetic field generated by the matched RF signal. The magnetic-field signal is sampled to provide magnetic-field signal sample values. Micro-arcing occurring in the plasma chamber is detected by determining whether the magnetic-field signal sample values correspond to a pre-defined magnetic-field pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system to detect micro-arcing in a plasma within a plasma chamber, the system comprising:
   a magnetic-field sensor configured to generate a magnetic-field signal based on a magnetic flux corresponding to the plasma; and
   micro-arc detecting logic configured to determine an average steady-state maximum amplitude for the magnetic-field signal over a first time in which the plasma is in a steady-state, and further configured to determine whether a first type of micro-arcing is present in the plasma chamber by evaluating whether a magnitude of the magnetic-field signal over a second time is less than the average steady-state maximum amplitude by at least a first amount.

2. The system of claim 1, wherein the magnetic-field sensor comprises a closed conductive path, and wherein the magnetic-field sensor is configured to generate the magnetic-field signal that varies in time commensurate with a time-varying magnetic flux passing through the closed conductive path.

3. The system of claim 1, wherein the magnetic-field sensor is configured to determine whether a magnitude of the magnetic-field signal over a third time exceeds the average steady-state maximum amplitude by at least a third amount to determine whether a second type of micro-arcing is present in the plasma chamber.

4. The system of claim 1, wherein the magnetic-field sensor is configured to determine whether a magnitude of the magnetic-field signal over a third time exceeds a predetermined integer multiple of the average steady-state maximum amplitude by at least a second amount to determine whether a second type of micro-arcing is present in the plasma chamber, the predetermined integer multiple being greater than one.

5. The system of claim 1, further comprising:
   a radio frequency (RF) generator configured to output a RF signal;

a transmission line coupled to the RF generator; and
wherein the plasma chamber is coupled to the RF generator via the transmission line, wherein the plasma chamber is configured to generate the plasma based on the RF signal.

6. The system of claim 5, wherein the micro-arc detecting logic is configured to sample the magnetic-field signal at a sampling frequency, thereby providing a plurality of magnetic-field samples, and further configured to determine whether a micro-arc has occurred in the plasma chamber based on the plurality of magnetic-field samples.

7. The system of claim 6, wherein the sampling frequency is greater than an RF frequency of the RF signal.

8. A system to detect micro-arcing in a plasma within a plasma chamber, the system comprising:
a magnetic-field sensor configured to generate a magnetic-field signal based on a magnetic flux corresponding to the plasma; and
micro-arc detecting logic configured to:
determine whether a first type of micro-arcing is present in the plasma chamber during a first time based on whether a magnitude of the magnetic-field signal over the first time exceeds an average steady-state maximum amplitude of the magnetic-field signal by at least a first amount, and
determine whether a second type of micro-arcing is present in the plasma chamber during a second time based on whether a magnitude of the magnetic-field signal over the second time is less than the average steady-state maximum amplitude by at least a second amount.

9. The system of claim 8, further comprising:
a radio frequency (RF) generator configured to output a RF signal;
a transmission line coupled to the RF generator; and
wherein the plasma chamber is coupled to the RF generator via the transmission line, and wherein the plasma chamber is configured to generate the plasma based on the RF signal.

10. The system of claim 9, wherein the micro-arc detecting logic is configured to sample the magnetic-field signal at a sampling frequency, thereby providing a plurality of magnetic-field samples, and is further configured to determine whether a micro-arc has occurred in the plasma chamber based on the plurality of magnetic-field samples.

11. The system of claim 10, wherein the sampling frequency is greater than an RF frequency of the RF signal.

12. The system of claim 8, wherein the magnetic-field sensor comprises a closed conductive path, wherein the magnetic-field sensor is configured to generate the magnetic-field signal that varies in time commensurate with a time-varying magnetic flux passing through the closed conductive path.

13. The system of claim 8, wherein the magnetic-field sensor is configured to determine whether a magnitude of the magnetic-field signal over the first time exceeds a predetermined integer multiple of the average steady-state maximum amplitude by at least a third amount to determine whether the first type of micro-arcing is present in the plasma chamber, the predetermined integer multiple being greater than one.

14. A system comprising:
a radio frequency (RF) generator configured to output a RF signal;
a transmission line coupled to the RF generator;
a plasma chamber coupled to RF generator via the transmission line, wherein the plasma chamber is configured to generate a plasma based on the RF signal;
a closed path conductive loop proximate to the transmission line and configured to generate a magnetic-field signal, the magnetic-field signal having an amplitude proportional to an amount of magnetic flux which passes through the closed path conductive loop and which arises due to the RF signal passing through the transmission line; and
a micro-arc detecting element configured to sample the magnetic-field signal at a sampling frequency, thereby providing a plurality of magnetic-field samples, and further configured to determine whether a micro-arc has occurred in the plasma chamber based on the plurality of magnetic-field samples.

15. The system of claim 14, wherein the sampling frequency is greater than an RF frequency of the RF signal.

16. The system of claim 14, wherein the micro-arc detecting element is configured to determine an average steady-state maximum amplitude for the magnetic-field signal over a first time in which the plasma is in a steady-state, and further configured to determine whether a magnitude of the magnetic-field signal over a second time exceeds the average steady-state maximum amplitude by at least a first amount to determine whether a first type of micro-arcing is present in the plasma chamber.

17. The system of claim 14, wherein the micro-arc detecting element is configured to determine an average steady-state maximum amplitude for the magnetic-field signal over a first time in which the plasma is in a steady-state, and further configured to determine whether a magnitude of the magnetic-field signal over a second time exceeds a predetermined integer multiple of the average steady-state maximum amplitude to determine whether a first type of micro-arcing is present in the plasma chamber, the predetermined integer multiple being greater than one.

18. The system of claim 14, wherein the micro-arc detecting element is configured to determine an average steady-state maximum amplitude for the magnetic-field signal over a first time in which the plasma is in a steady-state, and is further configured to determine whether micro-arcing is present in the plasma chamber by evaluating whether a magnitude of the magnetic-field signal over a second time is less than the average steady-state maximum amplitude.

19. The system of claim 18, wherein the micro-arc detecting element is further configured to determine whether a magnitude of the magnetic-field signal over a third time exceeds a predetermined integer multiple of the average steady-state maximum amplitude to determine whether micro-arcing is present in the plasma chamber, the predetermined integer multiple being greater than one.

20. The system of claim 18, wherein the micro-arc detecting element is further configured to determine whether a magnitude of the magnetic-field signal over a third time exceeds the average steady-state maximum amplitude by at least a first amount to determine whether micro-arcing is present in the plasma chamber.

* * * * *